(12) United States Patent
Kamimura et al.

(10) Patent No.: US 12,362,202 B2
(45) Date of Patent: Jul. 15, 2025

(54) SUBSTRATE PROCESSING METHOD AND SUBSTRATE PROCESSING APPARATUS

(71) Applicant: Tokyo Electron Limited, Tokyo (JP)

(72) Inventors: Fumihiro Kamimura, Kumamoto (JP); Masatoshi Kasahara, Kumamoto (JP); Teruomi Minami, Kumamoto (JP); Ikuo Sunaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/519,519

(22) Filed: Nov. 27, 2023

(65) Prior Publication Data

US 2024/0096654 A1 Mar. 21, 2024

Related U.S. Application Data

(62) Division of application No. 17/030,488, filed on Sep. 24, 2020, now Pat. No. 11,869,777.

(30) Foreign Application Priority Data

Sep. 27, 2019 (JP) .................................. 2019-177637

(51) Int. Cl.
*H01L 21/67* (2006.01)
*B08B 3/04* (2006.01)
(Continued)

(52) U.S. Cl.
CPC .......... *H01L 21/67051* (2013.01); *B08B 3/04* (2013.01); *B08B 7/0014* (2013.01);
(Continued)

(58) Field of Classification Search
CPC ......... H01L 21/67051; H01L 21/02057; H01L 21/67248; H01L 21/68764;
(Continued)

(56) References Cited

U.S. PATENT DOCUMENTS 11,869,777 B2 * 1/2024 Kamimura ........ H01L 21/67028
2003/0092264 A1 * 5/2003 Kajita .................. H01L 21/6708
257/E21.309
(Continued)

FOREIGN PATENT DOCUMENTS

CN 107591345 A 1/2018
JP 2013-243331 A 12/2013
(Continued)

*Primary Examiner* — Alexander Markoff
(74) *Attorney, Agent, or Firm* — Venjuris, P.C.

(57) ABSTRACT

A substrate processing method includes: increasing a temperature of a substrate by heating the substrate; after the increasing the temperature of the substrate, forming a liquid film of a pre-wetting liquid on a first surface of the substrate by supplying the pre-wetting liquid to the first surface of the substrate while heating and rotating the substrate at a first rotational speed; after the forming the liquid film, processing the first surface of the substrate with a chemical liquid by supplying the chemical liquid to the first surface of the substrate while heating and rotating the substrate at a second rotational speed that is lower than the second rotational speed; and after the processing the first surface of the substrate, decreasing the temperature of the substrate.

5 Claims, 9 Drawing Sheets

(51) Int. Cl.
*B08B 7/00* (2006.01)
*H01L 21/02* (2006.01)
*H01L 21/687* (2006.01)

(52) U.S. Cl.
CPC .. *H01L 21/02057* (2013.01); *H01L 21/67248* (2013.01); *H01L 21/68764* (2013.01)

(58) Field of Classification Search
CPC ........... H01L 21/67028; H01L 21/6708; H01L 21/67098; H01L 21/32134; B08B 3/04; B08B 7/0014; B08B 3/02
See application file for complete search history.

(56) References Cited

U.S. PATENT DOCUMENTS

| | | | |
|---|---|---|---|
| 2012/0064256 A1 | 3/2012 | Higashijima et al. | |
| 2016/0005630 A1* | 1/2016 | Fujiwara | H01L 21/6708 438/748 |
| 2016/0336170 A1* | 11/2016 | Ishida | H01L 21/67051 |
| 2017/0236729 A1* | 8/2017 | Kawabuchi | H01L 21/67028 134/10 |
| 2018/0182645 A1* | 6/2018 | Nakano | H01L 21/67051 |
| 2018/0254199 A1* | 9/2018 | Suzuki | H01L 21/30604 |
| 2018/0269056 A1* | 9/2018 | Emoto | H01L 21/67028 |
| 2019/0067047 A1* | 2/2019 | Tanizawa | H01L 21/67028 |
| 2019/0088469 A1* | 3/2019 | Tanaka | B08B 3/10 |
| 2019/0091736 A1* | 3/2019 | Okutani | B08B 3/08 |
| 2021/0098271 A1* | 4/2021 | Kamimura | B08B 7/0014 |

FOREIGN PATENT DOCUMENTS

| | | |
|---|---|---|
| JP | 2015-057816 A | 3/2015 |
| JP | 2015-076558 A | 4/2015 |
| JP | 2016-162922 A | 9/2016 |
| JP | 2016-189434 A | 11/2016 |
| JP | 2016-219773 A | 12/2016 |
| TW | 201707132 A | 2/2017 |
| TW | 201824437 A | 7/2018 |

\* cited by examiner

SUBSTRATE PROCESSING METHOD AND SUBSTRATE PROCESSING APPARATUS

CROSS-REFERENCE TO RELATED APPLICATIONS

This application is a divisional application of U.S. patent application Ser. No. 17/030,488, filed on Sep. 24, 2020, which claims priority from Japanese Patent Application No. 2019-177637, filed on Sep. 27, 2019, with the Japan Patent Office, all of which are incorporated herein in their entireties by reference.

TECHNICAL FIELD

The present disclosure relates to a substrate processing method and a substrate processing apparatus.

BACKGROUND

The process of manufacturing a semiconductor device includes a liquid processing process of performing a liquid processing by supplying a processing liquid to a substrate such as a semiconductor wafer. An example of the liquid processing is a chemical liquid cleaning or a wet etching, which is performed by supplying a heated chemical liquid to the center of the surface of a rotating substrate. The temperature of the heated chemical liquid that has been supplied to the center of the substrate is lowered while the chemical liquid spreads to the peripheral edge of the substrate. Further, the substrate is easily cooled at the peripheral edge thereof having a relatively high peripheral speed. Thus, it has been implemented to make the temperature of the substrate uniform by supplying a heated liquid, for example, water to the back surface of the substrate (see, e.g., Japanese Patent Laid-Open Publication No. 2015-057816).

SUMMARY

According to an aspect of the present disclosure, a substrate processing method include: increasing a temperature of a substrate by heating the substrate; after the increasing the temperature of the substrate, forming a liquid film of a pre-wetting liquid on a first surface of the substrate by supplying the pre-wetting liquid to the first surface of the substrate while heating and rotating the substrate at a first rotational speed; after the forming the liquid film, processing the first surface of the substrate with a chemical liquid by supplying the chemical liquid to the first surface of the substrate while heating and rotating the substrate at a second rotational speed that is lower than the second rotational speed; and after the processing the first surface of the substrate, decreasing the temperature of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Embodiments of a substrate processing apparatus will be described with reference to the accompanying drawings.

Figure 1:
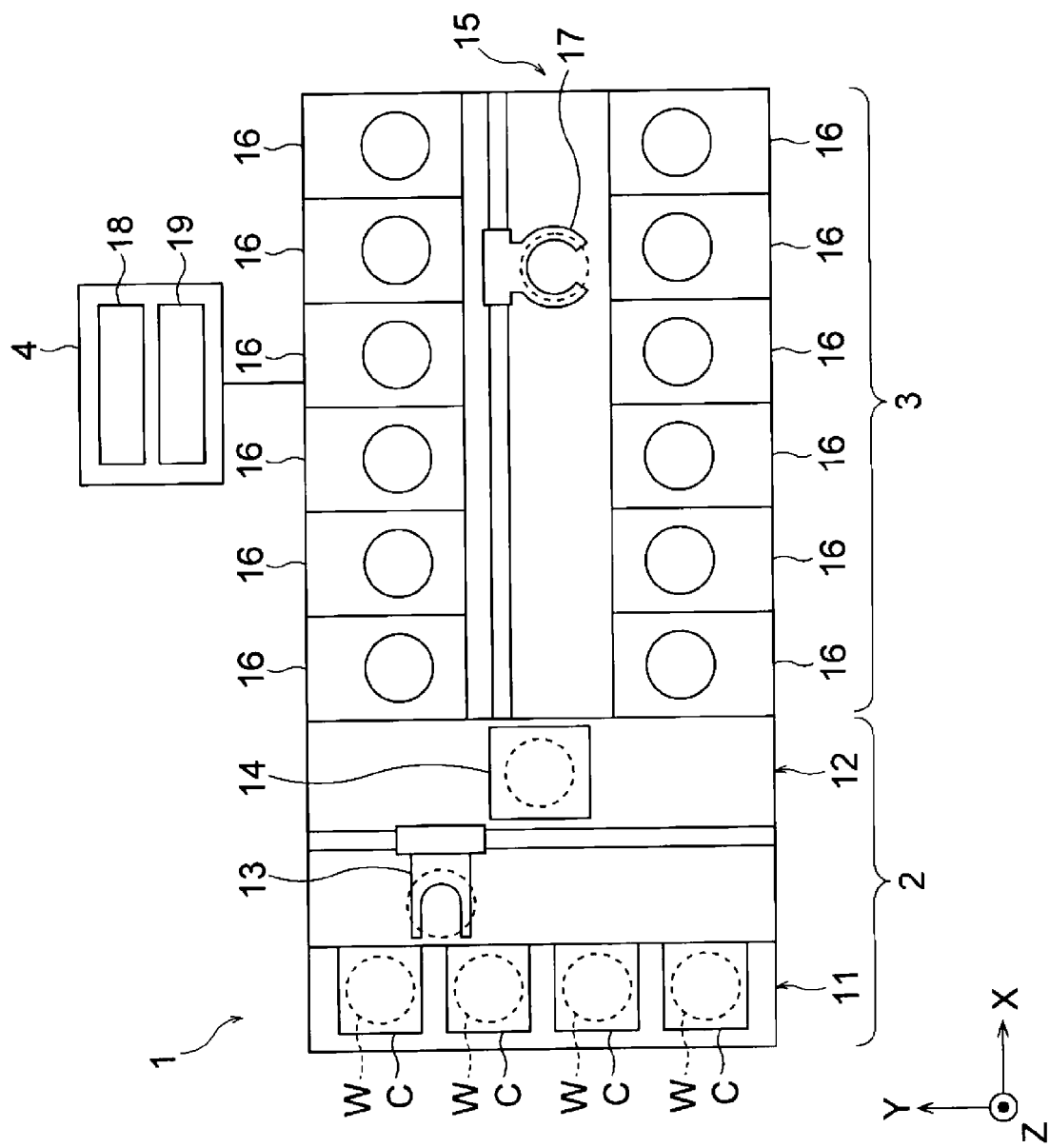
FIG. 1 is a vertical cross-sectional side view of a substrate processing system according to an embodiment of a substrate processing apparatus.

FIG. 1 is a view illustrating a schematic configuration of a substrate processing system according to an embodiment of the present disclosure. In the descriptions herein, in order to clarify positional relationships, an X-axis, a Y-axis, and a Z-axis which are orthogonal to each other will be defined, and the positive Z-axis direction will be defined as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placement section 11 and a transfer section 12. In the carrier placement section 11, a plurality of carriers C is placed to accommodate a plurality of substrates, i.e., semiconductor wafers (hereinafter, "wafers W") in the present embodiment, horizontally.

The transfer section 12 is provided adjacent to the carrier placement section 11, and provided with a substrate transfer device 13 and a delivery unit 14 therein. The substrate transfer device 13 is provided with a wafer holding mechanism configured to hold the wafer W. The substrate transfer device 13 is movable horizontally and vertically and pivotable around the vertical axis. The substrate transfer device 13 transfers the wafer W between each carrier C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. The substrate transfer device 17 is movable horizontally and vertically and pivotable around the vertical axis. The substrate transfer device 17 transfers the wafer W between the delivery unit 14 and each processing unit 16 by using the wafer holding mechanism.

Each processing unit 16 performs a predetermined substrate processing on the wafer W transferred by the substrate transfer device 17.

The substrate processing system 1 further includes a control device 4. The control device 4 is, for example, a computer and includes a controller 18 and a storage unit 19. The storage unit 19 stores a program for controlling various types of processing performed in the substrate processing system 1. The controller 18 controls the operation of the substrate processing system 1 by reading and executing the program stored in the storage unit 19.

The program may be recorded in a computer-readable recording medium, and installed from the recording medium to the storage unit 19 of the control device 4. The computer-readable recording medium may be, for example, a hard disk (HD), a flexible disk (FD), a compact disk (CD), a magnet optical disk (MO), or a memory card.

In the substrate processing system 1 configured as described above, first, the substrate transfer device 13 of the carry-in/out station 2 takes out a wafer W from a carrier C placed in the carrier placement section 11, and places the taken wafer W on the delivery unit 14. The wafer W placed on the delivery unit 14 is taken out from the delivery unit 14 by the substrate transfer device 17 of the processing station 3, and carried into a processing unit 16.

The wafer W carried into the processing unit 16 is processed by the processing unit 16, then carried out from the processing unit 16, and placed on the delivery unit 14 by the substrate transfer device 17. When the processed wafer W is placed on the delivery unit 14, the wafer W returns to the carrier C of the carrier placement section 11 by the substrate transfer device 13.

Figure 2:
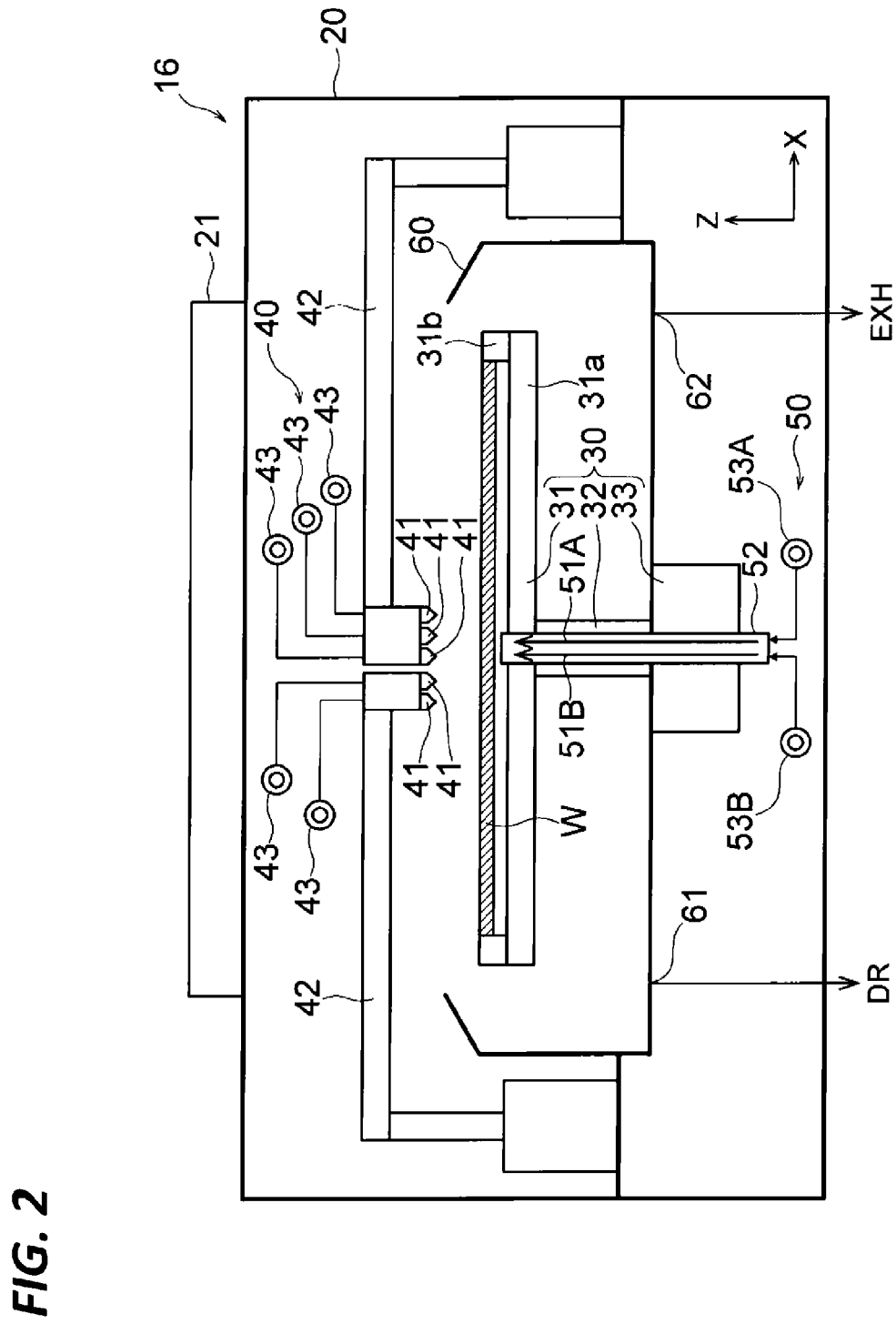
FIG. 2 is a schematic vertical cross-sectional view illustrating an example of a configuration of a processing unit provided in the substrate processing system of FIG. 1.

Next, a configuration of the processing unit 16 will be described with reference to FIG. 2.

The processing unit 16 includes a chamber 20, a substrate holding/rotating mechanism 30, a first processing fluid supply 40, a second processing fluid supply 50, and a recovery cup 60.

The chamber 20 accommodates the substrate holding/rotating mechanism 30 and the recovery cup 60. A fan filter unit (FFU) 21 is provided on the ceiling of the chamber 20. The FFU 21 forms a downflow in the chamber 20.

The substrate holding/rotating mechanism 30 includes a substrate holder 31, a support 32, and a rotation driving unit 33. The substrate holder 31 is configured as a mechanical chuck that includes a disc-shaped base 31a and a plurality of gripping claws 31b provided on the outer peripheral edge of the base 31a at intervals in the circumferential direction. The substrate holder 31 holds the wafer W horizontally by the gripping claws 31b. When the gripping claws 31b are gripping the substrate, a gap is formed between the upper surface of the base 31a and the lower surface of the wafer W.

The support 32 is a hollow member that extends vertically. The upper end of the support 32 is connected to the base 31a. When the rotation driving unit 33 rotates the support 32, the substrate holder 31 and the wafer W held by the substrate holder 31 rotate about the vertical axis.

The recovery cup 60 is disposed to surround the substrate holder 31. The recovery cup 60 collects a processing liquid scattered from the wafer W that rotates while being held by the substrate holder 31. A drain port 61 is formed at the bottom of the recovery cup 60. The processing liquid collected by the recovery cup 60 is discharged to the outside of the processing unit 16 through the drain port 61. An exhaust port 62 is formed at the bottom of the recovery cup 60. The atmosphere of the inner space of the recovery cup 60 is sucked through the exhaust port 62. A gas supplied from the FFU 21 is introduced into the recovery cup 60, and then, discharged to the outside of the processing unit 16 through the exhaust port 62.

The first processing fluid supply 40 supplies various processing fluids (e.g., a liquid, a gas, and a gas-liquid mixed fluid) to the upper surface of the wafer W held by the substrate holder 31 (in general, the front surface of the wafer W on which devices are formed). The first processing fluid supply 40 includes a plurality of front surface nozzles 41 that ejects a processing fluid toward the upper surface (first surface) of the wafer W. The front surface nozzles 41 are provided as many as necessary for performing a processing to be executed in the processing unit 16. While FIG. 2 illustrates five front surface nozzles 41, the number of front surface nozzles 41 is not limited to five.

The first processing fluid supply 40 includes one or more (two in the illustrated example) nozzle arms 42. Each nozzle arm 42 carries at least one of the plurality of front surface nozzles 41. Each nozzle arm 42 is able to move the carried front surface nozzle 41 between a position substantially directly above the rotation center of the wafer W (a processing position) and a retreating position outside the upper end opening of the recovery cup 60.

A processing fluid is supplied to each of the front surface nozzles 41 from a corresponding processing fluid supply mechanism 43. The processing fluid supply mechanism 43 may be configured by a processing fluid source such as a tank, a cylinder, a factory power or the like, a supply pipeline that supplies a processing fluid from the processing fluid source to the corresponding front surface nozzle 41, and an opening/closing valve and a flow rate adjustment device such as a flow rate control valve which are provided in the supply pipeline. In order to discharge a processing fluid (in particular, a processing liquid) that stays in the front surface nozzle 41 and the nearby supply pipeline, a drain pipeline may be connected to the supply pipeline. Since the processing fluid supply mechanism 43 is widely known in the technical field for a semiconductor manufacturing apparatus, illustration and detailed descriptions of the structure of the processing fluid supply mechanism 43 are omitted herein. The processing unit 16 is provided with a liquid receiver (not illustrated), such that a dummy dispense becomes possible when each front surface nozzle 41 is in the retreating position.

The second processing fluid supply 50 supplies various processing fluids (e.g., a processing liquid and a processing gas) to the lower surface of the wafer W held by the substrate holder 31 (in general, the back surface of the wafer W on which no device is formed). The second processing fluid supply 50 includes one or more (two in the illustrated example) back surface nozzles 51A and 51B that eject a processing fluid toward the lower surface (second surface) of the wafer W. As schematically illustrated in FIG. 2, a processing liquid supply pipe 52 extends vertically inside the hollow support 32. The upper end openings of two flow paths that extend vertically inside the processing liquid supply pipe 52 serve as the back surface nozzles 51A and 51B. The processing liquid supply pipe 52 is provided inside the support 32 so as to maintain a non-rotation state even when the substrate holder 31 and the support 32 are rotated.

Temperature adjustment DIW (deionized water) for adjusting the temperature of the wafer W is supplied from a temperature adjustment DIW supply mechanism 53A to the back surface nozzle 51A (a heating fluid nozzle). The back surface nozzle 51A and the temperature adjustment DIW supply mechanism 53A make up a heating fluid (temperature adjustment fluid) supply mechanism. Cooling CDIW (room-temperature DIW) for cooling the wafer W is supplied from a CDIW supply mechanism 53B (illustrated only in FIG. 2) to the back surface nozzle 51B. The back surface nozzle 51B and the CDIW supply mechanism 53B make up a cooling fluid supply mechanism. For example, the CDIW supply mechanism 53B may have a general well-known configuration which is similar to that of the processing fluid supply mechanism 43 for the front surface nozzles 41 described briefly above.

In the descriptions herein, the room-temperature DIW (e.g., 24° C.) will be referred to as "CDIW" in order to distinguish the room-temperature DIW from "HDIW" which is heated DIW.

Next, a configuration of the temperature adjustment DIW supply mechanism 53A for the back surface nozzle 51A will be described with reference to FIG. 3. One temperature adjustment DIW supply mechanism 53A is provided for each of the plurality of processing units 16 (16-1, 16-2, 16-3, . . . ). The configurations of the respective temperature adjustment DIW supply mechanisms 53A are substantially similar to each other.

The substrate processing system 1 includes an HDIW trunk pipe 23 connected to an HDIW source and a CDIW trunk pipe 24 connected to a CDIW source. The trunk pipes 23 and 24 supply the HDIW and the CDIW to all of the plurality of processing units 16 provided in one substrate processing system 1. The HDIW trunk pipe 23 is provided with a temperature sensor 25, and the CDIW trunk pipe 24 is provided with a temperature sensor 26.

It is the most common that the HDIW source and the CDIW source are factory powers of a semiconductor device manufacturing plant where the substrate processing system 1 is installed. However, for example, the HDIW source may be a tank provided as a component of the substrate processing system 1 for storing the HDIW. DIW is supplied to the tank from the HDIW source and the CDIW source which are the factory powers. In this case, a circulation pipeline connected to the tank and provided with a pump and a heater corresponds to the HDIW trunk pipe 23. The HDIW source may be a hot water generator that heats and sends out the DIW supplied from the HDIW source and the CDIW source which are factory powers.

The temperature adjustment DIW supply mechanism 53A includes a main pipeline 531 (a heated fluid line) branched from the HDIW trunk pipe 23. The main pipeline 531 is provided with a flow meter 532, a constant pressure valve 533, an opening/closing valve 534, a first merging point 535, a second merging point 536, a first branch point 537, an opening/closing valve 538, and a second branch point 539 in this order from the upstream side thereof. The downstream end of the main pipeline 531 is connected to the back surface nozzle 51A through the flow path in the processing liquid supply pipe 52.

The flow meter 532 and the constant pressure valve 533 make up a flow rate adjustment unit that adjusts the flow rate of the HDIW flowing through the main pipeline 531. The constant pressure valve 533 has a pilot port (details thereof not illustrated). The constant pressure valve 533 operates such that a secondary-side pressure is implemented according to an operation pressure (air pressure) supplied to the pilot port from an electropneumatic regulator (not illustrated). The operation pressure supplied to the pilot port of the constant pressure valve 533 is feedback-controlled by a control device (the control device 4 in FIG. 1 or its subordinate controller) such that a flow rate detected by the flow meter 532 becomes a desired value (set value).

The temperature adjustment DIW supply mechanism 53A further includes a diluting liquid pipeline 540 branched from the CDIW trunk pipe 24. The diluting liquid pipeline 540 is branched into a first branched diluting liquid pipeline 542 and a second branched diluting liquid pipeline 543 at a branch point 541. The first branched diluting liquid pipeline 542 is provided with a throttle 544 and an opening/closing valve 545. The second branched diluting liquid pipeline 543 is provided with a throttle 546 and an opening/closing valve 547. In the illustrated example, each of the throttles 544 and 546 is configured as an orifice with a check valve (a fixed throttle). The first branched diluting liquid pipeline 542 and the second branched diluting liquid pipeline 543 are connected to the main pipeline 531 at the first merging point 535 and the second merging point 536, respectively.

A flow meter 548 and a constant pressure valve 549 are provided on the upstream side of the diluting liquid pipeline 540 from the branch point 541. The flow meter 548 and the constant pressure valve 549 have the similar configuration and operation to those of the flow meter 532 and the constant pressure valve 533.

At the first branch point 537, a first drain line 550 is branched from the main pipeline 531. The first drain line 550 is provided with an opening/closing valve 551, a temperature sensor 552, and a throttle 553 (an orifice with a check valve (a fixed throttle) in the illustrated example) in this order from the upstream side thereof.

At the second branch point 539, a second drain line 554 is branched from the main pipeline 531. The second drain line 554 is provided with an opening/closing valve 555 and a throttle 556 (an orifice with a check valve (a fixed throttle) in the illustrated example) in this order from the upstream side thereof.

A temperature sensor 557 is provided on the downstream side of the main pipeline 531 relative to the second branch point 539.

When the HDIW source and the CDIW source are factory powers, the temperature of the HDIW that flows through the HDIW trunk pipe 23 is, for example, 70° C., and the temperature of the CDIW that flows through the CDIW trunk pipe 24 is, for example, 24° C. Since the temperatures fluctuate in some degree due to factors such as, for example, a change in outdoor temperature and a change in temperature of a clean room, the temperature sensors 25 and 26 monitor the temperatures.

As described later, the temperature adjustment HDIW is supplied from the back surface nozzle 51A to the back surface of the wafer W mainly for the purpose of adjusting the temperature of the wafer W. The temperature adjustment DIW supply mechanism 53A may supply only the HDIW or a mixed solution of the HDIW and the CDIW from the back surface nozzle 51A to the back surface of the wafer W. The temperature of the DIW supplied from the back surface nozzle 51A to the wafer W may be adjusted by changing a mixing ratio of the HDIW and the CDIW (a ratio of the flow rate of the HDIW that flows into the main pipeline 531 and the flow rate of the CDIW that flows into the main pipeline 531 through the diluting liquid pipeline 540 (542, 543)).

For example, it is assumed that the flow rate of the DIW to be supplied from the back surface nozzle 51A to the back surface of the wafer W is 1,500 ml/min, and the temperature of the DIW is 65° C. In this case, through a calculation, the flow rate of the 70° C. HDIW may be set to 1,340 ml/min, and the flow rate of the 24° C. CDIW may be set to 160 ml/min.

The control device 4 performs the calculation. Then, the control device 4 gives the flow rate of the HDIW obtained by the calculation as a set value (target value) SV to the flow meter 532, the constant pressure valve 533, and an HDIW flow rate feedback control system including an electropneumatic regulator (not illustrated). Similarly, the control device 4 gives the flow rate of the CDIW obtained by the calculator as a set value (target value) SV to the flow meter 548, the constant pressure valve 549, and a CDIW flow rate feedback control system including an electropneumatic regulator (not illustrated), and also outputs a signal for designating the opening/closing valve 545 or 547 of the branched diluting liquid pipeline 542 or 543 to be opened.

In the above-described HDIW flow rate feedback control system or CDIW flow rate feedback control system, a flow rate detected by the flow meter 532 or 548 is a measured value PV, and an operation pressure given from the electropneumatic regulator to the constant pressure valve 533 or 549 is an operation amount MV. The control device 4 adjusts the operation amount MV according to a deviation of the measured value PV from the set value SV.

In order to expand the range of the mixing ratio (the ratio of the maximum value/minimum value), the area of the aperture of the throttle 544 of the first branched diluting liquid pipeline 542 (a first low temperature fluid line) is set to be significantly larger than the area of the aperture of the throttle 546 of the second branched diluting liquid pipeline 543 (a second low temperature fluid line). Accordingly, by selectively opening any one of the opening/closing valve 545 of the first branched diluting liquid pipeline 542 and the opening/closing valve 547 of the second branched diluting liquid pipeline 543, it is possible to implement the flow rate range significantly larger than the flow rate range implemented by the constant pressure valve 549 alone (the ratio of the maximum flow rate/minimum flow rate), and further, it is possible to adjust the flow rate with a high accuracy.

The number of branched diluting liquid pipelines 542, 543, . . . is not limited to two in the illustrated example, and may be three or more. In this case, the branched diluting liquid pipelines are connected in parallel to the main pipeline 531, and provided with the opening/closing valves 545, 547, . . . and the throttles 544, 546, . . . , respectively. From the viewpoint of expanding the range of the mixing ratio, the apertures of the throttles may have different areas from each other.

The first drain line 550 is used for an operation to discard the DIW without supplying the DIW to the wafer W (also referred to as "throwaway" or "dummy dispense") until the temperature is stabilized.

The second drain line 554 is used for discarding the DIW that remains in the back surface nozzle 51A, the flow path in the processing liquid supply pipe 52 that communicates with the back surface nozzle 51A, and the nearby pipeline. As a result, the DIW of which temperature has not been controlled may be prevented from being ejected immediately after the ejection of the temperature adjustment DIW from the back surface nozzle 51A is started.

The temperature adjustment DIW supply mechanism 53A may also operate to cause the CDIW alone (CDIW that is not mixed with the HDIW) to be ejected from the back surface nozzle 51A. In this case, the back surface nozzle 51B and the CDIW supply mechanism 53B may be omitted. However, in this case, since the temperatures of the back surface nozzle 51A and the pipeline connected thereto become unstable, the back surface nozzle 51B and the CDIW supply mechanism 53B may be provided separately from the back surface nozzle 51A and the temperature adjustment DIW supply mechanism 53A.

Next, the liquid processing performed on the wafer W in the processing unit 16 will be described with reference to FIGS. 3 to 8. The wafer W is held in a horizontal posture by the substrate holding/rotating mechanism 30 such that the front surface of the wafer W to be processed becomes the upper surface, and is rotated about the vertical axis. The rotation of the wafer W is continued until a series of steps is ended.

In the descriptions of the liquid processing hereinafter, the landing point of the processing liquid supplied from the front surface nozzle 41 to the front surface of the wafer W is the rotation center of the wafer W or the vicinity thereof, unless otherwise specified. When the landing point of the processing liquid supplied from the front surface nozzle 41 to the front surface of the wafer W is the peripheral edge of the wafer, for example, when the front surface nozzle 41 performs a scanning operation, this case will be specified each time.

[Wafer Temperature Increasing Step]

First, a wafer temperature increasing step (a substrate temperature increasing step) is performed to increase the temperature of the wafer W to a temperature suitable for the liquid processing. The wafer temperature increasing step is performed by supplying a temperature adjustment fluid (a heated fluid) different from a chemical liquid used in a main processing step (a chemical liquid processing step) to be described later to the back surface of the wafer W. The temperature adjustment fluid is supplied by a temperature adjustment fluid supply (a heated fluid supply) that includes, for example, the back surface nozzle 51A and the temperature adjustment DIW supply mechanism 53A.

It is preferable that the temperature adjustment fluid is inexpensive and has a large heat capacity, and the most preferable temperature adjustment fluid is water. However, the temperature adjustment fluid may be a fluid other than water (DIW) and may be, for example, a gas (e.g., specifically heated nitrogen gas).

Prior to performing the wafer temperature increasing step, the opening/closing valve 555 is opened in a state where the opening/closing valve 538 is closed, so that the DIW remaining between the branch point 539 and the back surface nozzle 51A is discarded through the second drain line 554.

Meanwhile, in a state where the opening/closing valve 551 is opened, the opening/closing valve 534 is opened such that the HDIW flows into the main pipeline 531 at a controlled flow rate, and the opening/closing valve 545 or 547 is opened such that the CDIW flows into the main pipeline 531 through the merging point 535 or 536 at a controlled flow rate. At this time, as described above, the HDIW flow rate calculated by the control device 4 is given as an initial set value to the HDIW flow rate feedback control system, and the CDIW flow rate calculated by the control device 4 is given as an initial set value to the CDIW flow rate feedback control system.

The HDIW and the CDIW are mixed with each other in the main pipeline 531, and the temperature adjustment DIW is produced. In order to accelerate the mixing, a mixing accelerating device such as an inline mixer may be provided between the second merging point 536 and the first branch point 537.

There is a tendency that both the flow rate and the temperature of the temperature adjustment DIW are unstable immediately after the production of the temperature adjustment DIW is started. The unstable temperature mainly results from the fact that the pipeline in which the HDIW has not yet flowed (in particular, the main pipeline 531) has become cold. Accordingly, the opening/closing valve 551 is opened in a state where the opening/closing valve 538 is closed, and the temperature adjustment DIW immediately after the production of the temperature adjustment DIW is started is discarded through the first drain line 550 (dummy dispense). The temperature sensor 552 monitors the temperature of the temperature adjustment DIW that flows through the first drain line 550.

When a predetermined time elapses after the opening/closing valve 551 is opened so that the temperature is stabilized, the control device 4 may correct the (initial) set value SV of the HDIW flow rate and the (initial) set value SV of the CDIW flow rate based on a value detected by the temperature sensor 552, such that the value detected by the temperature sensor 552 reaches a target temperature. That is, when the value detected by the temperature sensor 552 does not increase to the target value, a feedback-control of the HDIW flow rate and the CDIW flow rate may be continued, for example, by making a correction to increase the set value (SV) of the HDIW flow rate and decrease the set value (SV) of the CDIW flow rate.

When the temperature detected by the temperature sensor 552 is stabilized at the target value, the opening/closing valve 551 is closed, and the opening/closing valve 538 is opened. The opening/closing valve 555 may be closed immediately after the discharge of the remaining DIW through the second drain line 554 is ended, or may be closed at the same time as the time when the opening/closing valve 551 is closed. As a result, the temperature adjustment DIW having a predetermined temperature is ejected from the back surface nozzle 51A toward the center of the back surface of the wafer W (the rotation center of the wafer or the vicinity thereof) at a predetermined flow rate. The ejection flow rate of the temperature adjustment DIW from the back surface nozzle 51A may be set to, for example, 1,500 ml/min.

When the HDIW is supplied from the back surface nozzle 51A without being mixed with the CDIW in the wafer temperature increasing step, first, the opening/closing valve 551 is opened in a state where the opening/closing valves 545, 547, and 538 are closed. Further, the opening/closing valve 555 is opened such that the liquid staying on the downstream side relative to the branch point 539 is discharged in advance. Then, the HDIW that has flowed from the HDIW trunk pipe 23 into the main pipeline 531 flows into the first drain line 550. At this time, the temperature sensor 552 monitors the temperature of the HDIW (the temperature adjustment DIW) that flows through the first drain line 550. When the value detected by the temperature sensor 552 increases so that the temperature is stabilized, the opening/closing valves 551 and 555 are closed, and the opening/closing valve 538 is opened. As a result, the ejection of the HDIW from the back surface nozzle 51A is started. At this time, the upstream side of the main pipeline 531 from the branch point 537 has been sufficiently warmed, so that the temperature of the HDIW ejected from the back surface nozzle 51A is stabilized in a relatively short time after the ejection is started.

Figure 4A:
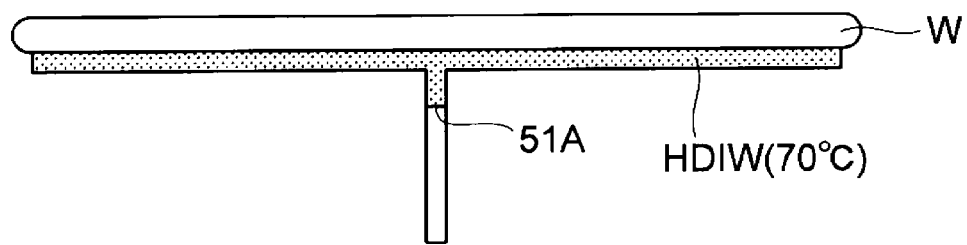
FIG. 4A is an operation view illustrating a liquid processing step according to an embodiment.

The rotation of the wafer W is started before the temperature adjustment DIW is ejected from the back surface nozzle 51A. As illustrated in FIG. 4A, the temperature adjustment DIW supplied to the center of the back surface of the wafer W flows toward the peripheral edge of the wafer W by the centrifugal force, and leaves to the outside of the wafer W. At this time, the back surface of the wafer W is covered with the liquid film of the temperature adjustment DIW. The wafer W is heated by the temperature adjustment DIW, so that the temperature of the wafer W increases.

The rotational speed of the wafer W in the wafer temperature increasing step may be the rotational speed ensuring that the temperature adjustment DIW supplied to the center of the back surface of the wafer W uniformly covers the back surface of the wafer W, and may be an appropriate rotational speed which is, for example, 200 rpm or more. When the rotational speed of the wafer W is set to be excessively high, the temperature adjustment DIW scattered to the outside of the wafer W may strongly collide with the recovery cup 60, and a large amount of DIW mist may drift around the wafer W. Further, when the rotational speed of the wafer W is set to be excessively high, the peripheral edge of the wafer having the relatively high peripheral speed may easily become cold, and the in-plane uniformity of the wafer temperature may be impaired. Thus, it is preferable to set the rotational speed of the wafer W in the wafer temperature increasing step in consideration of the problems.

The temperature adjustment DIW is ejected from the back surface nozzle 51A throughout the time period from the start of the wafer temperature increasing step to the start of the wafer temperature decreasing step. The temperature sensor 557 may monitor the temperature of the temperature adjustment DIW ejected from the back surface nozzle 51A. The set value SV of the HDIW flow rate and the set value SV of the CDIW flow rate may be corrected as described above based on the detection result of the temperature sensor 557. This correction may also be used when the temperature of the temperature adjustment DIW ejected from the back surface nozzle 51A is decreased from 70° C. to 52° C. as described later.

Figure 4B:
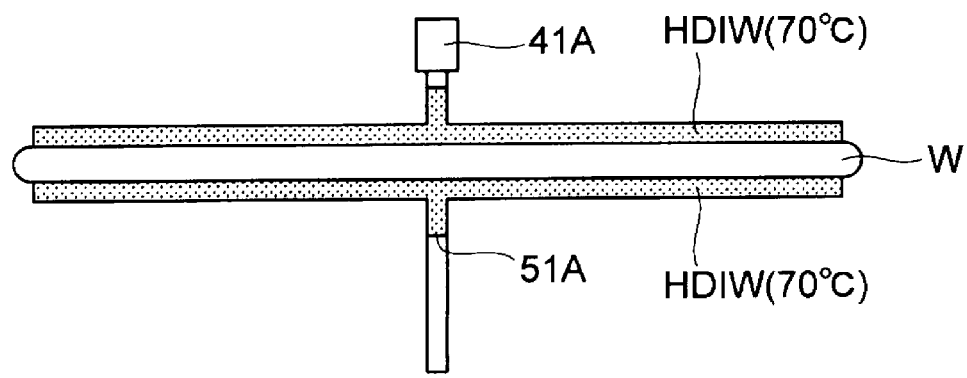
FIG. 4B is an operation view illustrating a liquid processing step according to an embodiment.
Figure 4C:
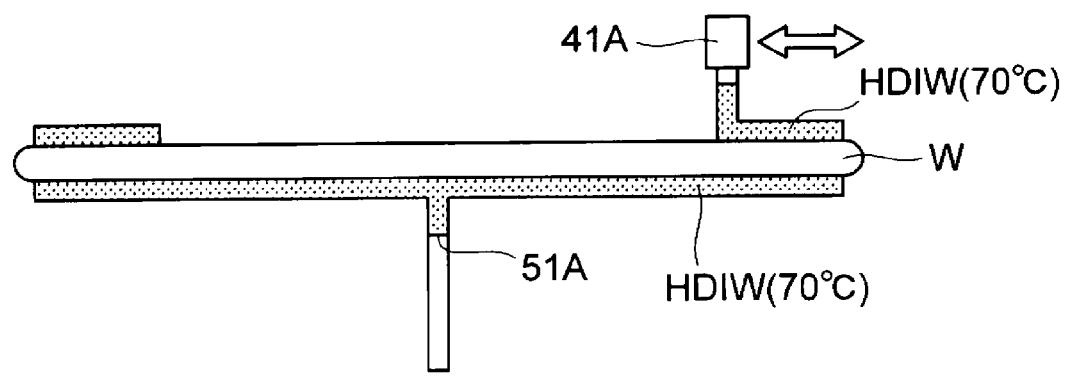
FIG. 4C is an operation view illustrating a liquid processing step according to an embodiment.

In the wafer temperature increasing step, the temperature adjustment DIW may also be supplied to the front surface of the wafer W, as illustrated in FIGS. 4B and 4C. In this case, it is preferable to perform the dummy dispense prior to supplying the temperature adjustment DIW to the front surface of the wafer W, so as to sufficiently warm the front surface nozzle 41 for supplying the temperature adjustment DIW and the pipeline connected thereto.

In FIG. 4B, the temperature adjustment DIW is supplied only to the center of the front surface of the wafer W from the front surface nozzle 41 for supplying the temperature adjustment DIW (hereinafter, also simply referred to as the "front surface temperature adjustment nozzle 41A") at a relatively large flow rate. The temperature adjustment DIW supplied to the center of the front surface of the wafer flows toward the peripheral edge of the wafer W by the centrifugal force, and leaves (is scattered) to the outside of the wafer W. At this time, the entire region of the front surface of the wafer W is covered with the liquid film of the temperature adjustment DIW. The wafer W is also heated by the temperature adjustment DIW supplied to the front surface of the wafer W, so that the temperature of the wafer W increases. As a result, the temperature of the wafer W may be increased more quickly than that in the case illustrated in FIG. 4A.

In FIG. 4C, the temperature adjustment DIW is supplied only to the peripheral edge of the front surface of the wafer W from the front surface temperature adjustment nozzle 41A at a relatively small flow rate. At this time, for example, the front surface temperature adjustment nozzle 41A may be caused to reciprocate radially, so as to repeatedly change the radial position of the liquid landing point of the temperature adjustment DIW on the front surface of the wafer W. At this time, the liquid film of the temperature adjustment DIW covers only the ring-shaped region of the peripheral edge of the front surface of the wafer W. In the case of FIG. 4C, since the peripheral edge of the wafer W which tends to easily become cold is locally heated, the in-plane uniformity of the temperature of the wafer may be further improved. The temperature adjustment DIW may be ejected in a state where the front surface temperature adjustment nozzle 41A is fixed at the same position (e.g., the position illustrated in FIG. 4C), instead of causing the front surface temperature adjustment nozzle 41A to reciprocate.

In any of the procedures illustrated in FIGS. 4A, 4B, and 4C for the wafer temperature increasing step, the temperature of the wafer W may be increased to be higher than the temperature of the wafer for the main processing step to be described later (also referred to as the "wafer temperature for the main processing"; for example, 50° C.). An actual test operation has confirmed that when the temperature of the wafer W is temporarily increased to a first temperature higher than the wafer temperature for the main processing, and then, is decreased, the time required until the temperature of the wafer W is stabilized at the wafer temperature for the main processing may be reduced.

[Liquid Film Forming Step and Main Processing Step]

Next, a liquid film forming step for forming a liquid film of a pre-wetting liquid on the entire region of the front surface of the wafer W and a main processing step (a chemical liquid processing step) for processing the front surface of the wafer W with a chemical liquid are performed. The pre-wetting liquid may be the same as the chemical liquid used in the main processing step to be described later, or may be another liquid which is easily replaced with the chemical liquid used in the main processing step to be described later (e.g., DIW or isopropyl alcohol (IPA)).

Even after the wafer temperature increasing step of FIG. 4A, 4B or 4C is ended, the temperature adjustment DIW is continuously ejected from the back surface nozzle 51A to the back surface of the wafer W. However, the temperature of the temperature adjustment DIW ejected from the back surface nozzle 51A is decreased to a temperature substantially equal to the wafer temperature for the main processing (e.g., 52° C.) by adjusting the mixing ratio of the CDIW. As a result, the temperature of the wafer W decreases toward the wafer temperature for the main processing.

Figure 5A:
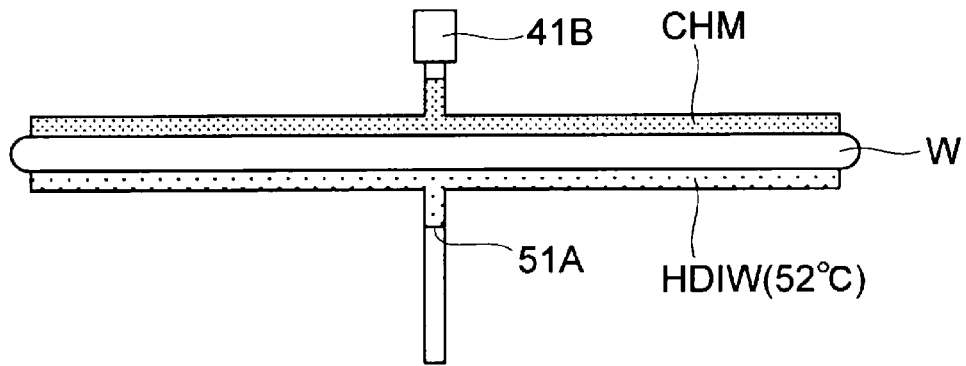
FIG. 5A is an operation view illustrating a liquid processing step according to an embodiment.

In the wafer temperature increasing step, when the temperature adjustment DIW is not supplied to the front surface of the wafer W as illustrated in FIG. 4A, the same room-temperature chemical liquid as used in the main processing step is supplied as the pre-wetting liquid from the front surface nozzle 41 for supplying the chemical liquid (hereinafter, also simply referred to as the "front surface chemical liquid nozzle 41B") (see FIG. 5A). The room-temperature chemical liquid is supplied from the front surface chemical liquid nozzle 41B to the center of the front surface of the wafer W (the rotation center of the wafer or the vicinity thereof) at a first ejection flow rate, while the wafer W is rotated at a first rotational speed.

At this time, in order to cause the chemical liquid to quickly spread over the entire region of the front surface of the wafer W, the first rotational speed may be set to be relatively high (e.g., about 800 rpm). Further, the first ejection flow rate may be set to be relatively large (e.g., about 1,000 ml/min). When the first ejection flow rate is set to be relatively large, the entire region of the front surface of the wafer W may be reliably covered with the liquid film of the chemical liquid, even though the rotational speed of the wafer W is set to be relatively high. Further, when the first ejection flow rate is set to be relatively large, it is possible to reliably prevent an occurrence of a dried region that results from the evaporation of the chemical liquid supplied to the front surface of the wafer W having the relatively high temperature (e.g., about 70° C.) at the time when the liquid film forming step is started.

In a case of a condition where it is difficult to uniformly form the liquid film, especially, the first rotational speed and the first ejection flow rate may be set to be relatively large, in order to prevent a fingering. Specifically, for example, there may be a case where a chemical liquid having a relatively low wettability with respect to the wafer W or a chemical liquid having a relatively high viscosity is used.

In the wafer temperature increasing step, when the temperature adjustment DIW is also supplied to the front surface of the wafer from the front surface temperature adjustment nozzle 41A as illustrated in FIG. 4B or 4C, the ejection of the temperature adjustment DIW from the front surface temperature adjustment nozzle 41A is stopped. Then, the liquid film forming step is performed by supplying the same room-temperature chemical liquid as used in the main processing step, as the pre-wetting liquid, from the front surface chemical liquid nozzle 41B to the center of the front surface of the wafer W. In this case as well, the state illustrated in FIG. 5A is obtained.

In a case where the liquid film forming step is performed from the state of FIG. 4B or 4C, the chemical liquid may be supplied to the front surface of the wafer W before the temperature adjustment DIW leaves from the inside of a recess of an irregular pattern formed on the front surface of the wafer W, in order to prevent the collapse of the pattern.

At this time, a first processing liquid which is supplied first (here, the temperature adjustment DIW) and a second processing liquid which is to be supplied later (here, the chemical liquid) may be switched in the manner described hereinafter. First, the switching starts from a state where the first processing liquid ejected from the first front surface nozzle 41 (here, the front surface temperature adjustment nozzle 41A) lands on the rotation center of the front surface of the wafer W. From this state, the second processing liquid ejected from the second front surface nozzle 41 (here, the front surface chemical liquid nozzle 41B) disposed close to the first front surface nozzle 41 is caused to land on a position slightly away from the rotation center of the front surface of the wafer W. Then, the first and second front surface nozzles 41 move in conjunction with each other, such that the landing point of the first processing liquid becomes away from the rotation center of the wafer, and the landing point of the second processing liquid approaches the rotation center of the wafer. When the landing point of the second processing liquid reaches the rotation center of the wafer, the ejection of the first processing liquid from the first front surface nozzle 41 is stopped. In this case, the ending time of the time period for supplying the first processing liquid to the front surface of the wafer and the starting time of the time period for supplying the chemical liquid to the front surface of the wafer overlap with each other. Hereinafter, in the descriptions herein, the processing liquid switching method may also be simply referred to as an "overlap switching method."

The overlap switching method may be performed while moving the first front surface nozzle 41 and the second front surface nozzle 41 which are carried by a common nozzle arm 42 such that the relationship described above is implemented. Alternatively, the overlap switching method may be performed while moving the first front surface nozzle 41 carried by the first nozzle arm 42 and the second front surface nozzle 41 carried by a second nozzle arm 42 different from the first nozzle arm 42 such that the relationship described above is implemented.

When there is no problem even though the configuration is adopted where the first processing liquid which is supplied first (here, the temperature adjustment DIW) and the second processing liquid which is to be supplied later (here, the chemical liquid) are ejected from the same front surface nozzle 41, the switching of the processing liquid may be performed as described hereinafter. That is, a first processing liquid supply mechanism and a second processing liquid supply mechanism are connected in parallel to one front surface nozzle 41. Then, substantially simultaneously with the stop of the supply of the first processing liquid from the first processing liquid supply mechanism to the front surface nozzle 41, the supply of the second processing liquid from the second processing liquid supply mechanism to the front surface nozzle 41 is started. In this way, the processing liquid may be switched without interrupting the supply of the processing liquid to the front surface of the wafer W. By using two separate front surface nozzles (the first front surface nozzle 41 and the second front surface nozzle 41), the ejection of the second processing liquid from the second front surface nozzle 41 may be started immediately after the ejection of the first processing liquid from the first front surface nozzle 41 is stopped. Hereinafter, in the descriptions herein, the processing liquid switching method may also be simply referred to as a "sequential switching method."

In the liquid film forming step, when the temperature adjustment DIW having a temperature substantially equal to the wafer temperature for the main processing is supplied from the back surface nozzle 51A to the back surface of the wafer W, and the room-temperature chemical liquid is supplied from the front surface nozzle 41 to the front surface of the wafer W, the wafer W is cooled, and the temperature of the wafer W decreases to the wafer temperature for the main processing.

In the liquid film forming step and the main processing step, since the room-temperature chemical liquid (e.g., 25° C.) is continuously supplied to the front surface of the wafer W from the front surface chemical liquid nozzle 41B, the temperature of the temperature adjustment DIW supplied from the back surface nozzle 41A to the back surface of the wafer W is set to a temperature slightly higher (e.g., 52° C. to 55° C.) than the wafer temperature for the main processing (e.g., 50° C.). As a result, the temperature of the wafer W (the temperature of the interface between the front surface of the wafer and the chemical liquid) may be maintained at the wafer temperature for the main processing. The temperature of the temperature adjustment DIW supplied to the back surface of the wafer W in the main processing step may be determined in consideration of factors that may affect the temperature of the wafer W such as, for example, the temperature of the chemical liquid supplied to the front surface of the wafer W in the main processing step, the flow rate of the chemical liquid, the specific heat of the chemical liquid, the rotational speed of the wafer W, the temperature in the chamber 20, and the flow rate of the downflow in the chamber 20.

Since the liquid film forming step not only uniformly forms the liquid film of the chemical liquid on the entire region of the front surface of the wafer W, but also stabilizes the temperature of the wafer W by decreasing the temperature of the wafer W to the wafer temperature for the main processing, the liquid film forming step may be regarded as a "stabilizing step." In the stabilizing step, the atmosphere in the chamber 20 may be adjusted to the atmosphere required for the main processing step. For example, the atmosphere in the chamber 20 may be adjusted to have a low oxygen concentration and a low humidity by supplying nitrogen gas into the chamber 20 from the FFU 21. In the stabilizing step, the rotational speed of the wafer W may be reduced from the first rotational speed to a second rotational speed which is the rotational speed of the wafer W in the main processing step or an appropriate rotational speed which is higher than the second rotational speed and lower than the first rotational speed.

When the temperature of the wafer W is stabilized at the wafer temperature for the main processing, the main processing step is performed. For the shift to the main processing step, in a state where the rotational speed of the wafer W is set to the second rotational speed, the temperature adjustment DIW (e.g., 52° C.) is continuously ejected from the back surface nozzle 51A, and the room-temperature chemical liquid (e.g., 25° C.) is continuously ejected from the front surface chemical liquid nozzle 41B to the front surface of the wafer W (see FIG. 6).

By reducing the rotational speed of the wafer W (setting to the second rotational speed), the tendency that the peripheral edge of the wafer W easily becomes cold is reduced. As a result, the uniformity of the processing result in the plane of the wafer may be improved. Further, by reducing the rotational speed of the wafer W, the liquid film may be maintained even when the ejection flow rate of the chemical liquid ejected from the front surface chemical liquid nozzle 41B is decreased.

The second ejection flow rate which is the flow rate of the chemical liquid ejected from the front surface chemical liquid nozzle 41B in the main processing step may be smaller than the first ejection flow rate which is the flow rate of the chemical liquid ejected from the front surface chemical liquid nozzle 41 in the liquid film forming step. As a result, the consumption of the chemical liquid may be reduced. Especially, when an expensive chemical liquid is used, the reduction of the consumption of the chemical liquid reduces processing costs. Further, even though the second ejection flow rate is small, the wafer W may be maintained at the temperature that ensures the appropriate reaction between the wafer W and the chemical liquid.

As for the front surface chemical liquid nozzle 41B, a front surface chemical liquid nozzle for a large flow rate and a front surface chemical liquid nozzle for a small flow rate may be provided. Alternatively, a chemical liquid supply line for a large flow rate and a chemical liquid supply line for a small flow rate may be connected in a selectively switchable manner to the single front surface chemical liquid nozzle 41B. As a result, the flow rate of the chemical liquid ejected from the front surface chemical liquid nozzle 41B may be quickly switched from the first ejection flow rate to the second ejection flow rate.

When the chemical liquid is continuously supplied at the second ejection flow rate while the wafer W is rotated with the second rotational speed for a predetermined time (e.g., about 30 seconds), the main processing step is completed. In the main processing step, since the front surface of the wafer W itself is sufficiently heated, the temperature of the interface between the front surface of the wafer W and the chemical liquid is sufficiently high. Thus, the reaction between the front surface of the wafer W and the chemical liquid is sufficiently progressed.

In an embodiment, the time required for the liquid film forming step is sufficiently shorter than the time required for the main processing step, and is, for example, 5 seconds or shorter, specifically, about 2 seconds to 3 seconds. Accordingly, even though the ejection flow rate of the chemical liquid per unit time in the liquid film forming step (the first ejection flow rate) is larger than the ejection flow rate of the chemical liquid per unit time in the main processing step (the second ejection flow rate), the total consumption amount of the chemical liquid is not significantly affected.

During the main processing step, the front surface chemical liquid nozzle 41B may be positioned directly above the center of the wafer W at all times, such that the chemical liquid may be landed on the center of the wafer W at all times (fixing the front surface nozzle). Alternatively, the main processing step may be performed while moving the front surface chemical liquid nozzle 41B thereby moving the landing point of the chemical liquid on the front surface of the wafer W (scanning of the front surface nozzle). In a case where the ejection flow rate of the chemical liquid from the front surface chemical liquid nozzle 41B in the main processing step (the second ejection flow rate) is set to be relatively small, the scanning condition of the front surface chemical liquid nozzle 41B (a scanning width, a scanning speed, and a scanning range) may be determined in order to prevent the occurrence of a dried region on the front surface of the wafer W.

In a case where the scanning of the front surface nozzle is performed in the main processing step, the scanning of the front surface nozzle may be performed in the liquid film forming step (the stabilizing step) under the same condition as that in the main processing step.

In the liquid film forming step and the main processing step, it is unnecessary to heat the chemical liquid in advance because the room-temperature chemical liquid is supplied. When the chemical liquid is kept in a heated state for a long time, the consumption of the chemical liquid such as the evaporation or deterioration of the chemical liquid may occur. The consumption of the chemical liquid does not occur at room temperature, or even when the consumption of the chemical liquid occurs, the degree of consumption is significantly lower than that when the chemical liquid is heated. This is advantageous from the viewpoint of reducing the processing costs, in particular, when an expensive chemical liquid is used. Further, there exists a chemical liquid that generates a vapor (gas) which is combustible or harmful to the human body when the chemical liquid is heated. When the chemical liquid of the present embodiment is used, it is unnecessary to heat the chemical liquid, which may save costs for ensuring the safety.

In order to prepare a heated chemical liquid in advance, a heated chemical liquid supply system is necessary, which includes machines such as, for example, a chemical liquid storage tank, a circulation pipeline connected to the chemical liquid storage tank, and a pump and a heater provided in the circulation pipeline. Meanwhile, the chemical liquid supply system for supplying the room-temperature chemical liquid requires fewer components than those for the heated chemical liquid supply system, and contributes to the reduction of costs for the substrate processing apparatus.

The supply temperature of the chemical liquid is not limited to the room temperature, and may be higher than the room temperature unless the consumption of the chemical liquid is significant An example of the step for which the technique according to the present embodiment is the most effective is an organic chemical liquid processing step included in a back-end-of-line (BEOL) process of the semiconductor manufacturing process. In the organic chemical liquid processing step, a high-priced organic chemical liquid is supplied in a heated state to the wafer. Recently, the degree of cleanliness required for the organic chemical liquid has increased with the miniaturization of a pattern, and the organic chemical liquid supplied once to the wafer could not have been collected and reused. Thus, it has become necessary to make a disposable organic chemical liquid. Further, in order to reduce processing costs, there has been a demand for reducing the amount of chemical liquid necessary to process one wafer. In the present embodiment, since the chemical liquid processing step (the main processing step) is performed while heating the back surface of the wafer with the temperature adjustment DIW, it is unnecessary to supply the heated organic chemical liquid at a large flow rate in order to increase the temperature of the wafer and ensure the in-plane uniformity of the wafer temperature. In the related art that does not heat the back surface of the wafer with the temperature adjustment DIW, the heated organic chemical liquid is supplied at a large flow rate (e.g., about 1,500 ml/min). In this way, the entire wafer is quickly heated to a temperature required for the reaction between the chemical liquid and the wafer, and the tendency that the temperature of the peripheral edge of the wafer decreases is reduced. In the organic chemical liquid processing step included in the BEOL process, according to the present embodiment, the ejection flow rate of the organic chemical liquid is, for example, about 150 ml/min even when the liquid film forming step is performed using the organic chemical liquid, and the ejection flow rate of the organic chemical liquid in the chemical liquid processing step (the main processing step) is equal to or lower than that in the liquid film forming step. That is, according to the present embodiment, the consumption amount of the organic chemical liquid may be reduced to about 1/10 of that of the related art. In the present embodiment, since the temperature required for the reaction between the chemical liquid and the wafer is maintained by heating the back surface of the wafer W with the temperature adjustment DIW, it is unnecessary to heat the organic chemical liquid in advance as described above. Thus, the consumption of the expensive organic chemical liquid may be suppressed, and furthermore, the consumption amount of the organic chemical liquid may be reduced.

The front surface chemical liquid nozzle 41B and the chemical liquid supply mechanism (the processing fluid supply mechanism) 43 connected to the front surface chemical liquid nozzle 41B make up a chemical liquid supply.

[Modification of Liquid Film Forming Step and Main Processing Step]

In a case where the wafer temperature increasing step of FIG. 4B or 4C is adopted, and in a case where the temperature adjustment DIW is easily replaced with the chemical liquid (e.g., when the DIW and the chemical liquid are compatible with each other), the temperature adjustment DIW supplied to the front surface of the wafer W in the wafer temperature increasing step may be used as the pre-wetting liquid. The transitions of the ejection flow rate and the temperature of the temperature adjustment DIW supplied from the back surface nozzle 51A to the back surface of the wafer W may be similar to those when the wafer temperature increasing step of FIG. 4A described above is adopted.

Figure 5B:
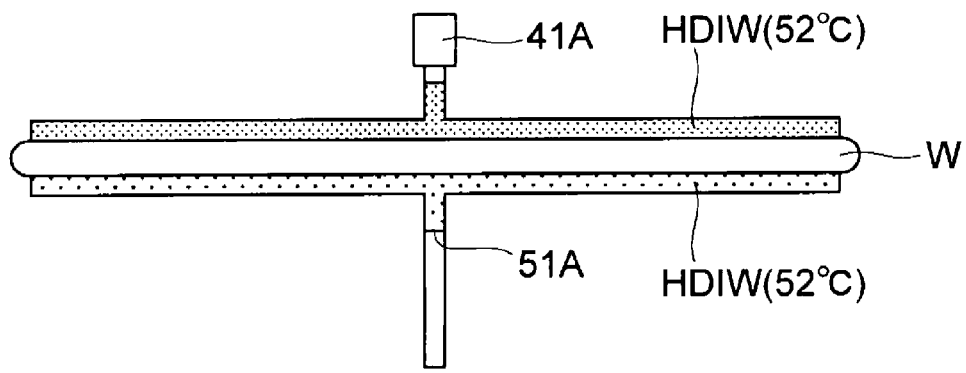
FIG. 5B is an operation view illustrating a liquid processing step according to an embodiment.
Figure 5C:
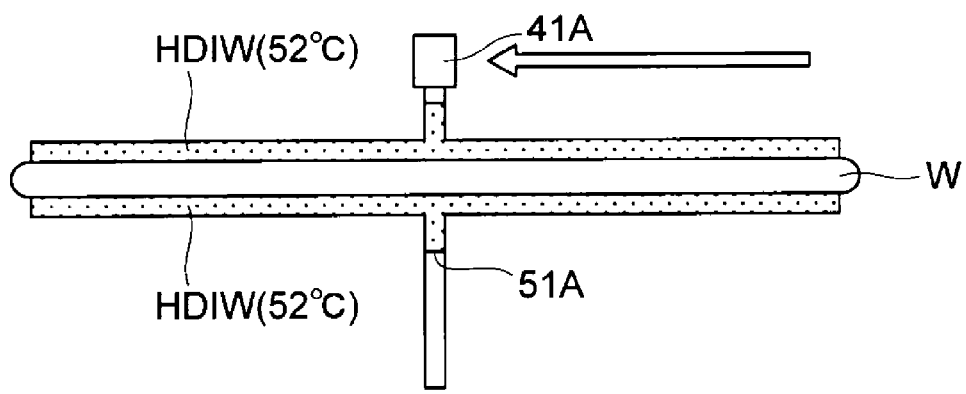
FIG. 5C is an operation view illustrating a liquid processing step according to an embodiment.

In a case where the wafer temperature increasing step of FIG. 4B is adopted, the front surface temperature adjustment nozzle 41A is continuously positioned directly above the center of the wafer W after the wafer temperature increasing step is ended, and in this state, the temperature of the temperature adjustment DIW ejected from the front surface temperature adjustment nozzle 41A is decreased from the first temperature (e.g., 70° C.) in the wafer temperature increasing step to a second temperature (e.g., 52° C.) lower than the first temperature (see FIG. 5B). As a result, the temperature of the wafer W decreases to be close to the wafer temperature for the main processing (e.g., 50° C.).

In a case where the wafer temperature increasing step of FIG. 4C is adopted, the front surface temperature adjustment nozzle 41A may be moved to be positioned directly above the center of the wafer W after the wafer temperature increasing step is ended, and the temperature of the temperature adjustment DIW ejected from the front surface temperature adjustment nozzle 41A may be decreased to the second temperature (e.g., 52° C.) (see FIG. 5C).

In any of the cases described above, the temperature adjustment DIW is used as the pre-wetting liquid. That is, in this case, since the wafer temperature increasing step may be regarded as performing the liquid film forming step as well, the step of ejecting the temperature adjustment DIW from the front surface temperature adjustment nozzle 41A at the second temperature (e.g., 52° C.) may be regarded as the stabilizing step.

The processing fluid supply mechanism 43 that supplies the temperature adjustment DIW to the front surface temperature adjustment nozzle 41A may have the similar configuration to that of the temperature adjustment DIW supply mechanism 53A that supplies the temperature adjustment DIW to the back surface nozzle 51A (e.g., the configuration where the temperature is adjusted by adjusting the mixing ratio of the HDIW and the CDIW).

Figure 6:
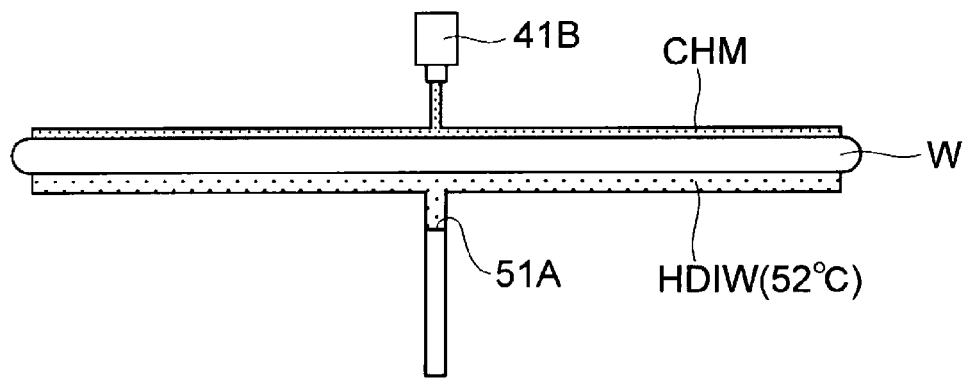
FIG. 6 is an operation view illustrating a liquid processing step according to an embodiment.

When the temperature of the wafer W is stabilized at the wafer temperature for the main processing, the ejection of the temperature adjustment DIW from the front surface temperature adjustment nozzle 41A is stopped, and the ejection of the chemical liquid from the front surface chemical liquid nozzle 41B is started, so as to start the main processing step (see FIG. 6). In this case, the processing liquid to be supplied may be switched from the temperature adjustment DIW to the chemical liquid, by using the overlap switching method described above. The processing liquid to be supplied may be switched from the temperature adjustment DIW to the chemical liquid, by using the sequential switching method.

At a time point slightly before the temperature of the wafer W is stabilized at the wafer temperature for the main processing, the ejection of the temperature adjustment DIW from the front surface temperature adjustment nozzle 41A may be stopped, and the ejection of the chemical liquid from the front surface chemical liquid nozzle 41B may be started.

In the main processing step, the landing point of the chemical liquid ejected from the front surface chemical liquid nozzle 41B may be set to the rotation center of the front surface of the wafer or the vicinity thereof. During the main processing step, the landing point of the chemical liquid may be moved by causing the front surface chemical liquid nozzle 41B to perform the scanning operation.

In the modification described above as well, the rotational speed of the wafer W in the main processing step (the second rotational speed) may be set to be smaller than the rotational speed of the wafer W in the liquid film forming step (the first rotational speed). As a result, the tendency that the peripheral edge of the wafer W easily becomes cold may be reduced.

In the modification described above as well, the ejection flow rate of the chemical liquid from the front surface chemical liquid nozzle 41B in the main processing step may be the same as the second ejection flow rate in the embodiment described above.

When the chemical liquid is supplied from the front surface chemical liquid nozzle 41B to the front surface of the wafer W for a predetermined time, the main processing step is completed.

[Wafer Temperature Decreasing Step (Substrate Temperature Decreasing Step)]

The wafer temperature decreasing step is performed by supplying a temperature adjustment (cooling) fluid different from the chemical liquid used in the main processing step (the chemical liquid processing step) to the back surface of the wafer W. It is preferable that the temperature adjustment fluid is inexpensive and has a relatively large heat capacity, and the most preferable temperature adjustment fluid is the CDIW.

The wafer temperature decreasing step is performed as described hereinafter. After the main processing step is completed, the ejection of the temperature adjustment DIW from the back surface nozzle 51A is stopped, and the CDIW is ejected from the back surface nozzle 51B to the back surface of the wafer W. As a result, the temperature of the wafer W decreases, and the rate of the reaction between a removal target (or a reaction target) on the front surface of the wafer W and the chemical liquid decreases. The ejection of the CDIW from the back surface nozzle 51B is continued until a rinsing step is ended.

[Rinsing Step]

Figure 7:
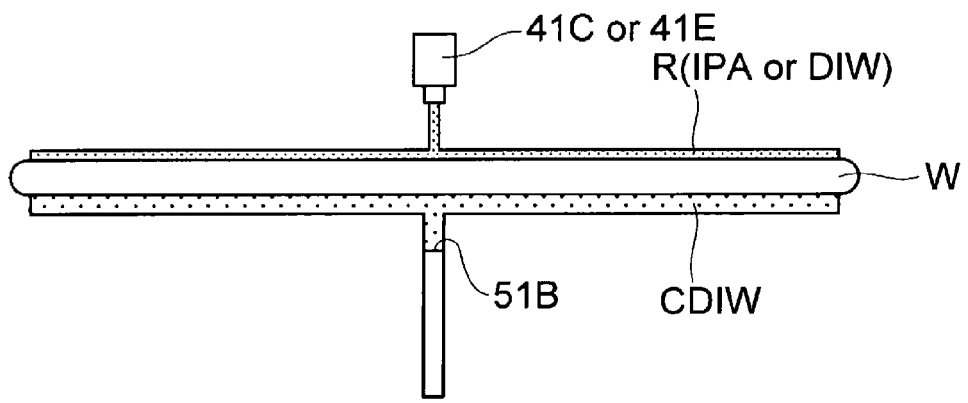
FIG. 7 is an operation view illustrating a liquid processing step according to an embodiment.
Figure 8:
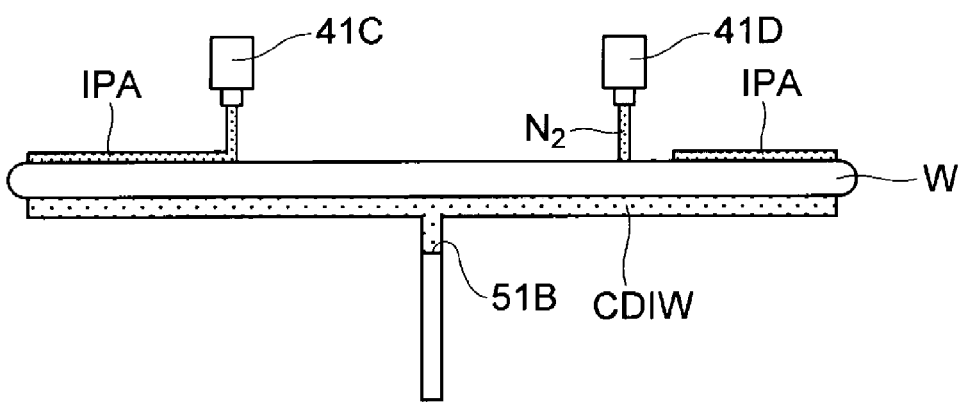
FIG. 8 is an operation view illustrating a liquid processing step according to an embodiment.

In parallel with the ejection of the CDIW from the back surface nozzle 51B, a rinse liquid is supplied to the front surface of the wafer W from the front surface nozzle 41 for supplying the rinse liquid, so as to perform the rinsing step on the front surface of the wafer (see FIG. 7). When the temperature of the wafer W sufficiently decreases, the ejection of the CDIW from the back surface nozzle 51B may be stopped.

When the DIW may not be used as the rinse liquid, for example, when an organic solvent such as IPA is used as the rinse liquid, the rinsing step may be performed along the following procedure.

<First Procedure for IPA Rinsing>

In a first procedure, the supply of the chemical liquid from the front surface chemical liquid nozzle 41B is stopped, the chemical liquid is removed from the front surface of the wafer W by shaking the wafer W for a predetermined time (e.g., several seconds), and then, the ejection of IPA from the front surface nozzle 41 for supplying the IPA (hereinafter, also simply referred to as the "front surface IPA nozzle 41C") is started. Then, the IPA is supplied from the front surface IPA nozzle 41C to the wafer W for a predetermined time, so as to perform a rinsing processing on the front surface of the wafer W.

<Second Procedure of IPA Rinsing>

In a second procedure, the state where the chemical liquid is ejected from the front surface chemical liquid nozzle 41B is switched to the state where the IPA is ejected from the front surface IPA nozzle 41C, by using the overlap switching method described above. Then, the IPA is supplied from the front surface IPA nozzle 41C to the wafer W for a predetermined time, so as to perform the rinsing processing on the front surface of the wafer W.

[Drying Step]

After the IPA rinsing is performed along the first or second procedure, a drying step is performed. For example, the drying step may be performed by moving the landing point of the IPA ejected from the front surface IPA nozzle 41C on the front surface of the wafer from the center of the wafer W to the peripheral edge of the wafer W, while supplying a drying gas having a low oxygen concentration and a low humidity such as, for example, nitrogen gas to the front surface of the wafer W (see FIG. 8). The drying gas may be ejected from the front surface nozzle 41 for supplying the drying gas (hereinafter, also simply referred to as the "front surface gas nozzle 41D"), and in this case, the front surface IPA nozzle 41C and the front surface gas nozzle 41D may be moved in conjunction with each other such that the position for spraying the drying gas onto the front surface of the wafer may be maintained at a position slightly radially inward from the landing point of the IPA ejected from the front surface IPA nozzle 41C on the front surface of the wafer.

The drying step is not limited to the drying step described above, and after the first or second procedure (of the IPA rinsing) described above is performed, the ejection of the IPA from the front surface IPA nozzle 41C may be simply stopped, and the wafer W may be dried by the shake-off operation.

When the DIW is used as the rinse liquid, the rinsing step may be performed along the procedure described below, using the front surface nozzle 41 for supplying the CDIW to the front surface of the wafer W (hereinafter, also simply referred to as the "front surface rinsing nozzle 41E").

During the drying step, the ejection of the CDIW from the back surface nozzle MB may be stopped. The HDIW may be ejected from the back surface nozzle MA in order to accelerate the drying.

<Procedure for DIW Rinsing>

The state where the chemical liquid is supplied to the front surface of the wafer W is switched to the state where the room-temperature DIW (CDIW) is supplied, using the front surface chemical liquid nozzle 41B and the front surface rinsing nozzle 41E according to the overlap switching method described above. When the CDIW is supplied from the front surface rinsing nozzle 41E for a predetermined time (see FIG. 7), the DIW rinsing is completed.

Then, the state where the CDIW is supplied to the front surface of the wafer W is switched to the state where the IPA is supplied, using the front surface rinsing nozzle 41E and the front surface IPA nozzle 41C according to the overlap switching method described above. When the IPA is supplied from the front surface IPA nozzle 41C for a predetermined time, the CDIW on the front surface of the wafer W is replaced with the IPA.

Then, the similar drying step to the drying step described above is performed.

When the DIW may not be used as the rinse liquid, the cooling of the wafer W after the chemical liquid processing step is performed mainly by the CDIW supplied to the back surface of the wafer W. Since the expensive IPA is not generally supplied at a large flow rate, the contribution of the IPA supplied to the front surface of the wafer W to the cooling of the wafer W is insignificant. When the DIW may be used as the rinse liquid, the cooling of the wafer W may be performed quickly by supplying the CDIW not only to the back surface of the wafer W but also to the front surface of the wafer W at a large flow rate.

When the drying step is ended, the series of liquid processing steps for one wafer W is ended. Then, the wafer W is carried out from the processing unit 16.

The processing liquid existing on the front surface of the wafer W at the start time of the drying step is not limited to the IPA, and may be a solvent, other than the IPA, which has a relatively low level of surface tension (at least, a surface tension lower than that of the DIW) enough to prevent the collapse of a pattern on the front surface of the wafer W. The processing liquid existing on the front surface of the wafer W at the start time of the drying step may be a liquid having a higher volatility than that of the DIW.

According to the embodiment described above, the temperature of the contact interface between the front surface of the wafer W and the chemical liquid is controlled by supplying the temperature adjustment DIW (HDIW, CDIW or a mixed solution thereof) to the back surface of the wafer W. Thus, the intended reaction may be implemented even though the chemical liquid to be reacted with the front surface of the wafer W at a high temperature is supplied in a state of having the room temperature. As a result, it is possible to prevent the consumption of the chemical liquid, reduce the consumption amount of the chemical liquid, and implement the processing with a high in-plane uniformity.

Figure 9:
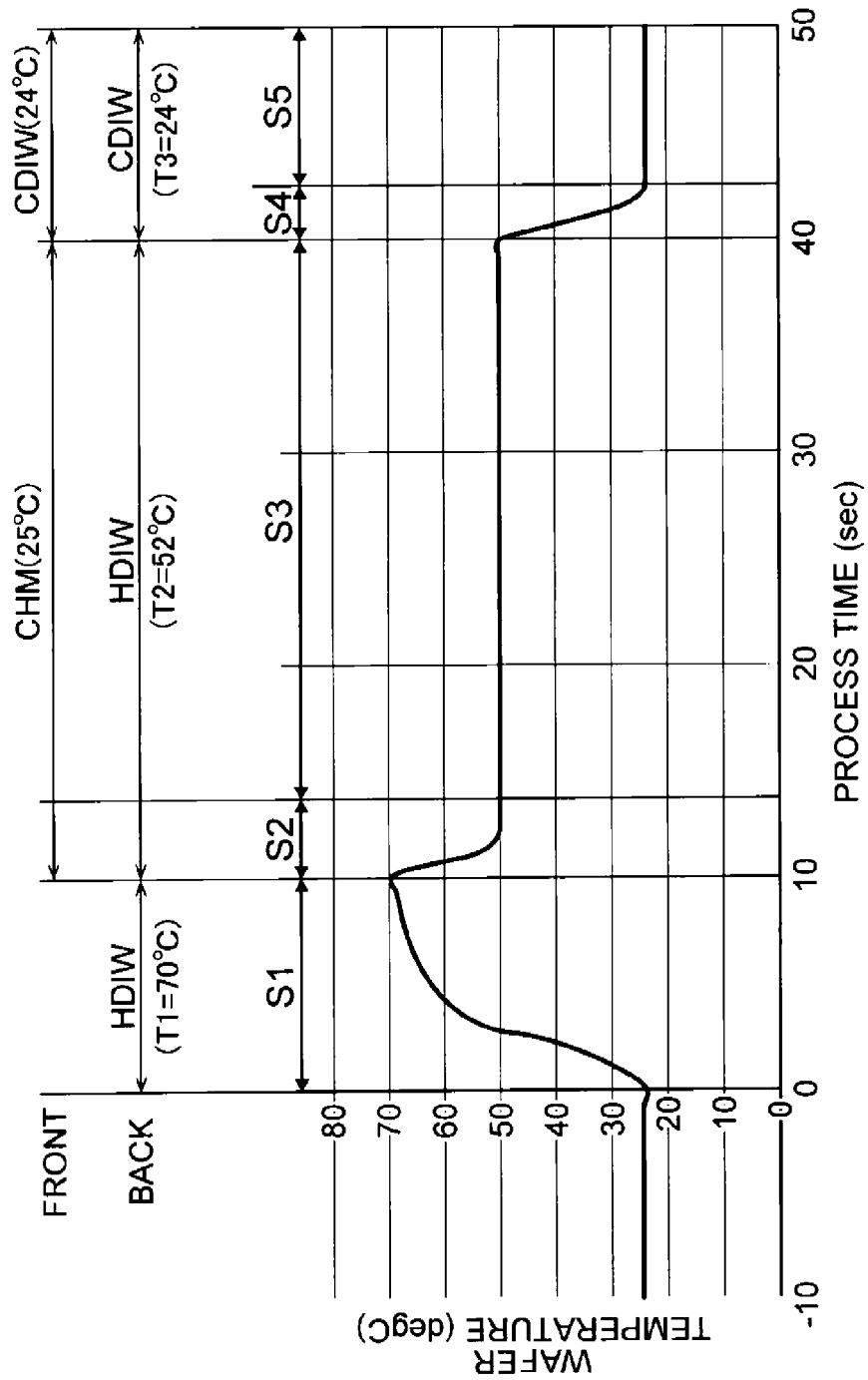
FIG. 9 is a graph representing an example of a transition of a wafer temperature during a time period from a wafer temperature increasing step to a rinsing step.

Descriptions will be made on an example of the transition of the wafer temperature during the time period from the wafer temperature increasing step to the rinsing step, with reference to FIG. 9. In the wafer temperature increasing step S1, the 70° C. HDIW is supplied as the temperature adjustment liquid to the back surface BACK of the wafer W. After the elapse of 10 seconds from the start of the wafer temperature increasing step S1, the temperature of the wafer W reaches about 70° C. Then, in the liquid film forming step S2, the 52° C. HDIW is supplied as the temperature adjustment liquid to the back surface of the wafer W, and the room-temperature (25° C.) chemical liquid CHM is supplied to the front surface FRONT of the wafer W. After the elapse of about 3 seconds from the start of the liquid film forming step S2, the wafer temperature is stabilized at 50° C. which is the wafer temperature for the main processing. Then, in the main processing step S3, that is, in the chemical liquid processing step, the 52° C. HDIW is continuously supplied to the back surface of the wafer W, and the room-temperature (25° C.) chemical liquid CHM is continuously supplied to the front surface of the wafer W. As described above, the rotational speed of the wafer and the ejection flow rate of the chemical liquid in the main processing step S3 are lower than those in the liquid film forming step (S2). The main processing step S3 is performed for about 17 seconds. Then, in the wafer temperature decreasing step S4, the 24° C. CDIW is supplied to the back surface of the wafer W, and the temperature of the wafer W decreases to the room temperature in about 2 seconds. In the example of FIG. 9, the 24° C. CDIW is supplied as the rinse liquid to the front surface of the wafer W simultaneously with the start of the wafer temperature increasing step S4. This CDIW is a cooling liquid that decreases the temperature of the wafer W, and is also a rinse liquid that rinses away the chemical liquid on the front surface of the wafer W. The rinsing step S5 is performed by continuously supplying the 24° C. CDIW as the rinse liquid to the front surface of the wafer W even after the temperature of the wafer W is stabilized at room temperature. In the example of FIG. 9, the wafer temperature decreasing step S4 is also included as a portion of the rinsing step S5.

In the embodiment described above, the separate front surface nozzles 41 supply the different processing liquids, respectively. However, the present disclosure is not limited thereto. For example, one front surface nozzle 41 may supply two or more types of processing liquids unless any problem occurs even though the same nozzle supplies the processing liquids. In the embodiment described above, the back surface nozzle 51A or 51B supplies only the DIW for adjusting the temperature of the wafer W. However, the back surface nozzle 51A may be configured to supply another processing liquid such as a chemical liquid. When one front surface nozzle supplies a plurality of types of processing liquids, a plurality of processing liquid supply mechanisms is connected in parallel to the front surface nozzle 41 in the manner that the connection is switchable by a switching valve (or a plurality of opening/closing valves). This configuration is well-known, and is not described in detail herein.

Figure 10:
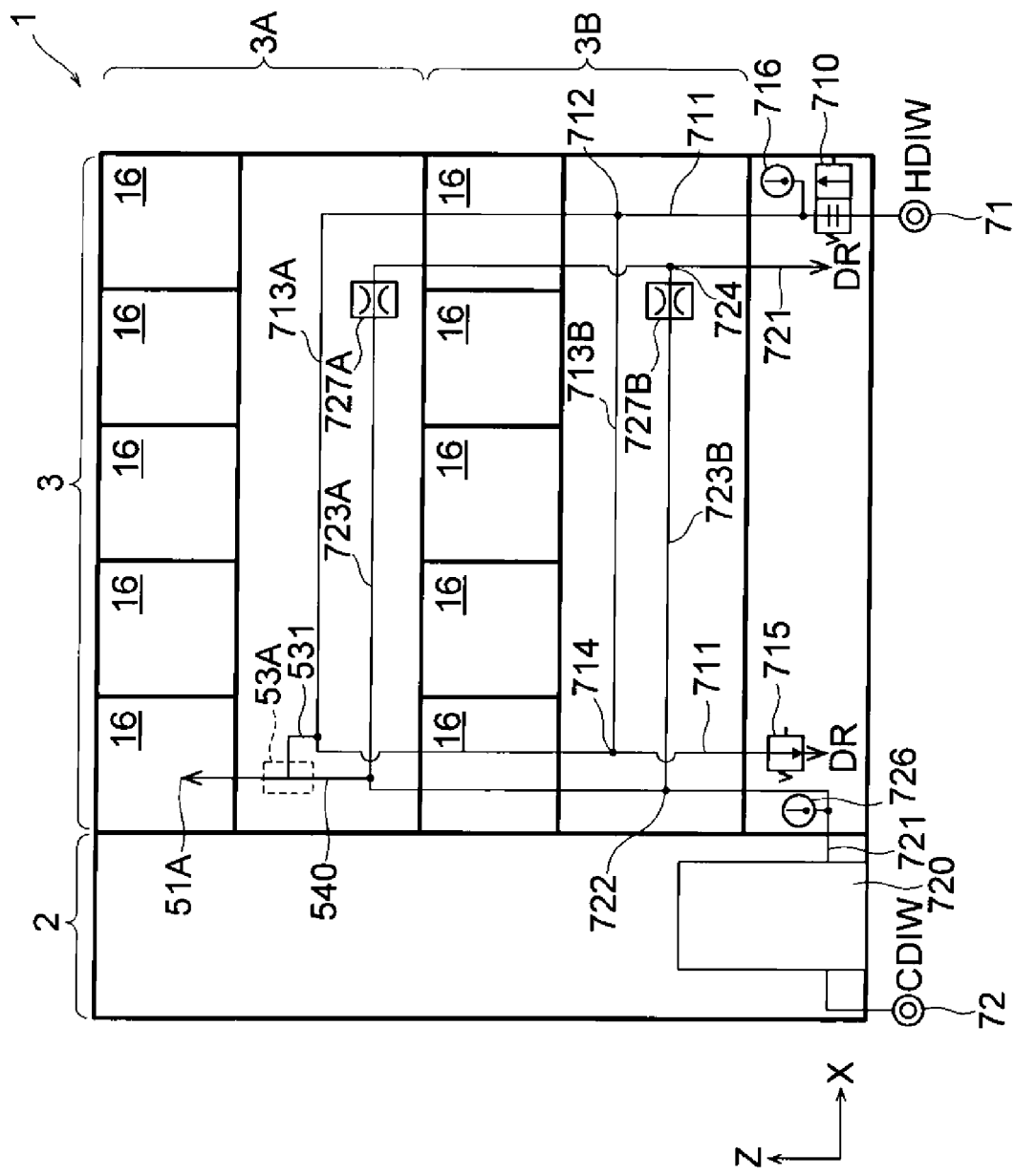
FIG. 10 is a view of a piping system and others schematically illustrating an example of HDIW and CDIW piping systems in the substrate processing system.

Next, an example of the piping systems of the HDIW and the CDIW in the substrate processing system 1 will be briefly described with reference to FIG. 10. The processing station 3 of the substrate processing system 1 has a two-layer structure including an upper layer 3A and a lower layer 3B. In FIG. 10, the reference numeral 71 represents an HDIW source which is a factory power, and the reference numeral 72 represents a CDIW source which is a factory power.

The upstream end of an HDIW pipeline 711 is connected to the HDIW source 71. At a branch point 712, the HDIW pipeline 711 is branched into a branched pipeline 713A for the upper layer 3A and a branched pipeline 713B for the lower layer 3B. An opening/closing valve 710 and a temperature sensor 716 are provided on the upstream side of the HDIW pipeline 711 from the branch point 712. The branched pipelines 713A and 713B merge with each other again at a merging point 714 to form the single HDIW pipeline 711. The downstream end of the HDIW pipeline 711 is connected to a factory drain line DR. A back pressure valve 715 is provided on the downstream side relative to the merging point 714.

The upstream end of a CDIW pipeline 721 is connected to the CDIW source 72. The CDIW pipeline 721 is branched at a branch point 722 into a branched pipeline 723A for the upper layer 3A and a branched pipeline 723B for the lower layer 3B. A $CO_2$ bubbler 720 and a temperature sensor 726 are provided on the upstream side of the CDIW pipeline 721 from the branch point 722. The branched pipelines 723A and 723B merge with each other again at a merging point 724 to form the single CDIW pipeline 721. The downstream end of the CDIW pipeline 721 is connected to the factory drain line DR. Orifices 727A and 727B (fixed throttles) for controlling the pressure are provided at the most downstream portions of the branched pipelines 723A and 723B (indicating the downstream portions relative to the connection point to the processing unit 16 present on the most downstream side).

Figure 3:
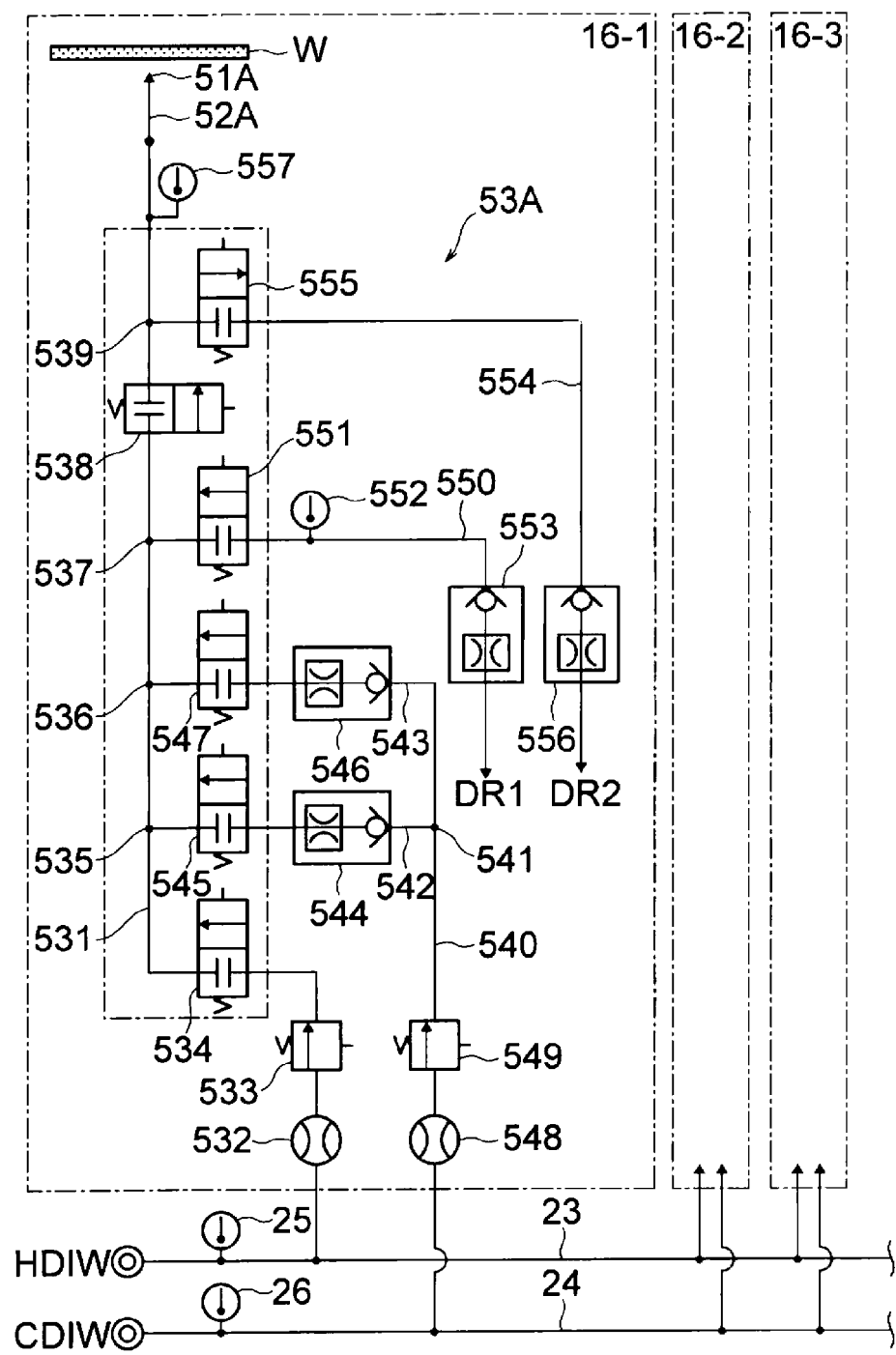
FIG. 3 is a view of a piping system and others illustrating an example of a temperature adjustment DIW supply mechanism that supplies temperature adjustment DIW to a back surface nozzle of a processing unit.

The branched pipeline 713A (713B) corresponds to the HDIW trunk pipe 23 in the fluid circuit diagram of FIG. 3. The branched pipeline 723A (723B) corresponds to the CDIW trunk pipe 24 in the fluid circuit diagram of FIG. 3. That is, in the example of FIG. 10, the HDIW taken out from the branched pipeline 713A (713B) and the CDIW taken out from the branched pipeline 723A (723B) are mixed with each other by the temperature adjustment DIW supply mechanism 53A (represented by the dashed line in FIG. 10), and is supplied to the back surface nozzle 51A. The configuration of the temperature adjustment DIW supply mechanism 53A in FIG. 10 is similar to the configuration of the temperature adjustment DIW supply mechanism 53A in FIG. 2. While one temperature adjustment DIW supply mechanism 53A is provided for each processing unit 16, FIG. 10 illustrates only one temperature adjustment DIW supply mechanism 53A for the simplification of the drawing.

Figure 11:
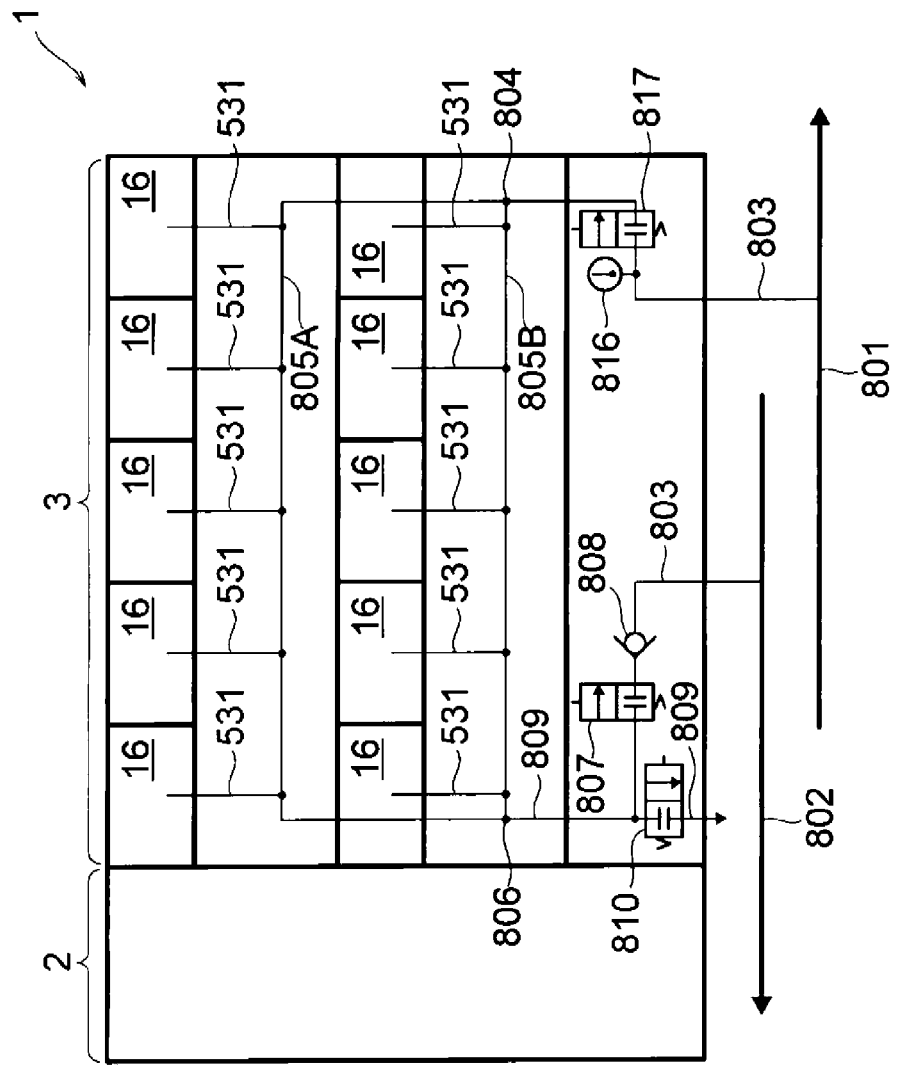
FIG. 11 is a view of a piping system and others schematically illustrating another example of the HDIW piping system in the substrate processing system.

FIG. 11 illustrates another example of the HDIW piping system in the substrate processing system 1. FIG. 11 omits the illustration of the CDIW piping system. In this example, the upstream end of an HDIW pipeline 803 is connected to an HDIW supply line 801 which is a factory power. The HDIW pipeline 803 is branched into a branched pipeline 805A for the upper layer 3A and a branched pipeline 805B for the lower layer 3B, at a branch point 804. An opening/closing valve 817 and a temperature sensor 816 are provided on the upstream side of the HDIW pipeline 803 from the branch point 804. The branched pipelines 805A and 805B merge with each other again at a merging point 806 to form the single HDIW pipeline 803. An opening/closing valve 807 and a check valve 808 are provided on the downstream side of the HDIW pipeline 803 relative to the merging point 806. The downstream end of the HDIW pipeline 803 is connected to an HDIW return line 802 which is a portion of a factory power system. A drain pipeline 809 is branched from the HDIW pipeline 803 between the merging point 806 and the opening/closing valve 807. An opening/closing valve 810 is provided in the drain pipeline 809. During the normal operation of the substrate processing system 1, the opening/closing valves 807 and 817 are opened, and the opening/closing valve 810 is closed. When the operation of the substrate processing system 1 is stopped for the purpose of performing the maintenance or the like, the opening/closing valves 807 and 817 are closed, and the opening/closing valve 810 is opened to discharge the DIW in the pipeline. In this example, unlike the example of FIG. 10, no back pressure valve is provided at the downstream end of the HDIW pipeline 803.

The substrate to be processed is not limited to a semiconductor wafer (the wafer W), and may be any substrate such as a glass substrate or a ceramic substrate which is used in the semiconductor device manufacturing field.

According to the present disclosure, it is possible to improve the in-plane uniformity of a liquid processing which is performed by supplying a chemical liquid to a rotating substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a substrate holder configured to hold a substrate having a first surface and a second surface that is an opposite surface to the first surface;
   a rotation driver configured to rotate the substrate holder;
   a heated fluid supply including a first nozzle provided above the substrate, a second nozzle provided below the substrate, a drain line and a temperature sensor provided in the drain line, each of the first nozzle and the second nozzle being configured to supply a heated liquid to the substrate;
   a chemical liquid supply including a third nozzle provided above the substrate and configured to supply a chemical liquid to the substrate; and
   a controller, wherein the controller is configured to execute a process including:
increasing a temperature of the substrate by supplying the heated liquid having a first temperature either only to the second surface of the substrate using the second nozzle or to both the first surface and the second surface of the substrate using the first nozzle and the second nozzle, respectively;
after the increasing the temperature of the substrate, forming a liquid film on the first surface of the substrate while rotating the substrate at a first rotational speed by the rotation driver:
either by supplying the heated liquid having a second temperature to the first surface and the second surface of the substrate using the first nozzle and the second nozzle, respectively when the heated liquid has been supplied to both the first surface and the second surface of the substrate at the increasing the temperature of the substrate, or by supplying the chemical liquid having a temperature lower than the first temperature and the second temperature to the first surface of the substrate using the third nozzle when the heated liquid has been supplied only to the second surface of the substrate at the increasing the temperature of the substrate, and
after the forming the liquid film, processing the first surface of the substrate with the chemical liquid while rotating the substrate at a second rotational speed lower than the first rotational speed by the rotation driver, by supplying the heated liquid to the second surface of the substrate using the second nozzle, and supplying the chemical liquid to the first surface of the substrate using the chemical liquid supply,
wherein the heated liquid is discarded through the drain line until a temperature of the heated liquid detected by the temperature sensor reaches the first temperature, and
when the heated liquid reaches the first temperature, the heated liquid is supplied either only to the second surface of the substrate or to both the first surface and the second surface of the substrate in the increasing the temperature of the substrate.

2. The substrate processing apparatus according to claim 1, wherein the heated fluid supply includes:

a heated fluid line connected to a heated fluid source at an upstream end thereof, and connected to the first nozzle and the second nozzle at a downstream end thereof; and
a low temperature fluid line connected to a low temperature fluid source at an upstream end thereof, connected to the heated fluid line at a downstream end thereof, and configured to supply a low temperature fluid having a lower temperature than that of the heated liquid.

3. The substrate processing apparatus according to claim 2, wherein the controller adjusts a temperature of the liquid ejected from the first nozzle and the second nozzle, by adjusting a mixing ratio of the low temperature fluid to the heated liquid.

4. The substrate processing apparatus according to claim 3, wherein the heated fluid supply further includes:
a first opening/closing valve configured to open/close the drain line; and
a second opening/closing valve provided at a downstream portion of the heated fluid line relative to the branch point,
wherein the drain line is branched from the heated fluid line at a branch point present at a downstream portion of the heated fluid line relative to a position where the low temperature fluid merges with the heated fluid line, and
wherein the controller opens the first opening/closing valve in a state where the second opening/closing valve is closed, until the temperature detected by the temperature sensor reaches the first temperature, so as to cause the heated liquid to flow from the drain line, and when the temperature detected by the temperature sensor reaches the first temperature, closes the first opening/closing valve and opens the second opening/closing valve so as to cause the heated liquid to be ejected from the first nozzle and the second nozzle in the increasing the temperature of the substrate.

5. The substrate processing apparatus according to claim 4, wherein while opening the first opening/closing valve in a state where the second opening/closing valve is closed so as to cause the heated liquid to flow from the drain line, the controller controls a mixing ratio of the low temperature fluid to the heated liquid based on the temperature detected by the temperature sensor.

* * * * *